(12) United States Patent
Wang et al.

(10) Patent No.: US 8,928,367 B2
(45) Date of Patent: Jan. 6, 2015

(54) PRE-CHARGE CIRCUIT WITH REDUCED PROCESS DEPENDENCE

(71) Applicant: SanDisk Technologies Inc., Plano, TX (US)

(72) Inventors: Sung-En Wang, San Jose, CA (US); Feng Pan, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/780,619

(22) Filed: Feb. 28, 2013

(65) Prior Publication Data

US 2014/0240005 A1    Aug. 28, 2014

(51) Int. Cl.
| | | |
|---|---|---|
| H02M 3/00 | (2006.01) | |
| G05F 1/00 | (2006.01) | |
| H03K 17/22 | (2006.01) | |

(52) U.S. Cl.
CPC .................................... *H03K 17/223* (2013.01)
USPC ........................................... 327/112; 327/530

(58) Field of Classification Search
None
See application file for complete search history.

(56) References Cited

U.S. PATENT DOCUMENTS

| | | | |
|---|---|---|---|
| 5,448,156 A | 9/1995 | Tsay | |
| 5,721,485 A | 2/1998 | Hsu et al. | |
| 5,910,738 A | 6/1999 | Shinohe et al. | |
| 6,046,624 A * | 4/2000 | Nam et al. | ..................... 327/530 |
| 6,127,786 A | 10/2000 | Moisin | |
| 7,206,230 B2 | 4/2007 | Li et al. | |
| 7,319,314 B1 | 1/2008 | Maheshwari et al. | |
| 7,352,210 B2 | 4/2008 | Luo | |
| 7,372,320 B2 | 5/2008 | Pan | |
| 7,400,186 B2 | 7/2008 | Tschanz et al. | |
| 7,672,674 B2 | 3/2010 | Mahany et al. | |
| 7,719,244 B2 | 5/2010 | Heilmann | |
| 7,973,594 B2 | 7/2011 | Amrutur et al. | |
| 8,031,550 B2 | 10/2011 | Chen | |
| 8,294,442 B2 | 10/2012 | Zhu | |
| 8,629,697 B2 * | 1/2014 | Kim | ............................. 327/109 |
| 2002/0089317 A1 | 7/2002 | Khouri et al. | |
| 2006/0119421 A1 | 6/2006 | Kouno et al. | |
| 2011/0133710 A1 | 6/2011 | Pancholi et al. | |
| 2011/0181257 A1 | 7/2011 | Pancholi et al. | |
| 2013/0069608 A1 | 3/2013 | Gakhar et al. | |
| 2013/0169251 A1 | 7/2013 | Wan et al. | |

OTHER PUBLICATIONS

U.S. Appl. No. 13/750,794 entitled "LDO/HDO Architecture Using Supplementary Current Source to Improve Effective System Bandwidth," filed Jan. 25, 2013, 21 pages.
U.S. Appl. No. 13/750,808 entitled "Improvements in Settling Time and Effective Band Width for Op-Amps Using Miller Capacitance Compensation," filed Jan. 25, 2013, 20 pages.

* cited by examiner

*Primary Examiner* — Lincoln Donovan
*Assistant Examiner* — Terry L Englund
(74) *Attorney, Agent, or Firm* — Davis Wright Tremaine

(57) ABSTRACT

A pre-charging circuit, such as can be used to pre-charge a data bus, is largely process independent. A push-pull type of arrangement is used, where the output of the pre-charge circuit is initially connected to a supply level through one transistor, then connected to ground by another transistor. These transistors can be controlled by one or more comparators that have as inputs a reference level and feedback from the output. The reference level is generated by a circuit that tracks the threshold voltage of the other devices in the circuit in order to reduce process dependency of the output level. The circuit can also include a device to provide an extra VDD assist to the output.

12 Claims, 4 Drawing Sheets

US 8,928,367 B2

PRE-CHARGE CIRCUIT WITH REDUCED PROCESS DEPENDENCE

FIELD OF THE INVENTION

This invention pertains generally to circuits for the pre-charging of other circuit element and, more particularly, to process independent pre-charge circuits.

BACKGROUND

On integrated circuits, some elements often need to be charged up to a certain level before they can be relied upon to accurately function. For example, it may be desired to pre-charge a data bus so that it is ready when it is needed to transmit data. To improve efficiency of operation, the circuit can include pre-charge circuitry to set an initial level on the element before its operation. Ideally such a circuit should efficiently bring the element to this initial level without using excess power or current and in a way that is process independent.

SUMMARY OF THE INVENTION

According to a general aspect of the invention, a pre-charging circuit includes a supply transistor, a reference generator block, and a pre-charge driver block. The supply transistor is connected between a first supply level and a pre-charge output node. The reference generator block provides a reference voltage level. The pre-charge driver block is connected to receive the reference voltage level and has an output connected to the gate of the supply transistor. The pre-charge driver block includes first and second transistors and comparison circuitry, where the first transistor is connected between a second supply level and the output of the pre-charge driver block and the second transistor is connected between the output of the pre-charge driver block and ground. The comparison circuitry is connected to receive the reference voltage level and feedback from the output of the pre-charge driver block and connected to the gates of the first and second transistors. During a pre-charge operation the comparison circuitry is initially enabled to control the first transistor and, after a delay, subsequently enabled to control the second transistor.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The following presents pre-charging circuitry that can pre-charge circuit elements to a well controller level and that is process dependent. By having the pre-charge circuit able to have the elements brought to the wanted level across process corners, this allows the element to be charged enough to operate properly, but not too high, which would result in greater than expected power consumption. To provide an example, FIG. 1 looks at the case of an internal data bus.

Figure 1:
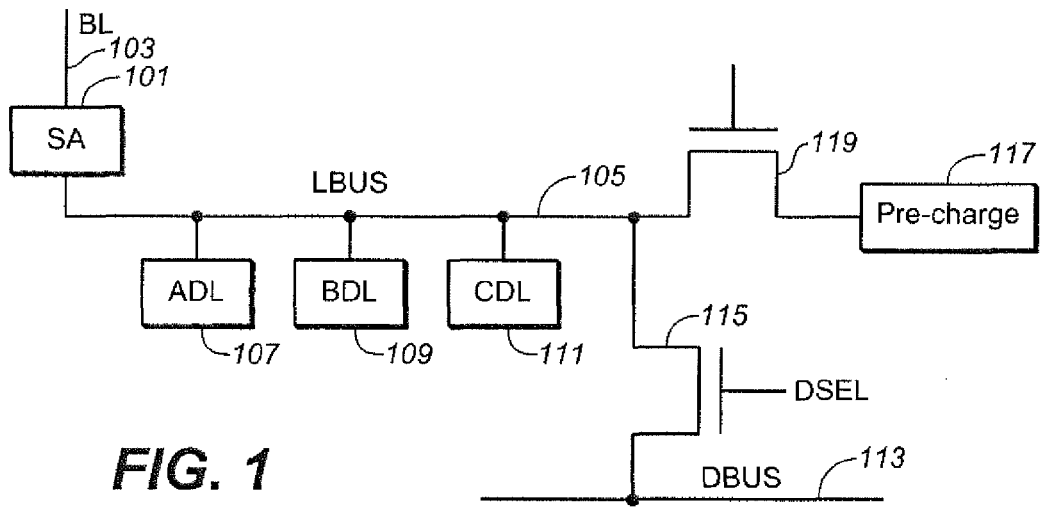
FIG. 1 is a bus structure to provide an example of where the exemplary embodiments can be used.

In FIG. 1, a sense amp SA 101 is connectable to a bit line BL 103 of a memory array and, by way of a local data bus LBUS 105, to several data latches ADL 107, BDL 109, and CDL 111. To transfer out the data, the local bus LBUS 105 used to transfer data between the latches and the sense amp is also connected through a select gate DSEL 115 to the main data bus DBUS 113. (More detail on suitable examples of sense amps are described in U.S. patent application Ser. No. 13/744,219 and latch structures are discussed in U.S. Pat. Nos. 7,206,230 and 8,102,705.) To ensure that the structure is ready to operate when needed, LBUS 105 can be pre-charged by a circuit 117 that can be connected by way of switch 119. If the LBUS operates in the domain of the supply level VDD, one approach is just to pre-charge LBUS to VDD; however, this is higher than needed and, in the example of sensing circuitry of non-volatile memories have a large number of such elements, a significant waste of power. For example, in a typical Flash memory device, a single pre-charge circuit may be connectable for use with thousands such busses. A lower level can instead be used, but as this is delivered though a transistor acting as switch, the level supplied to LBUS will depend on the threshold Vt of the device 119 and, consequently, be process dependent.

Figure 2:
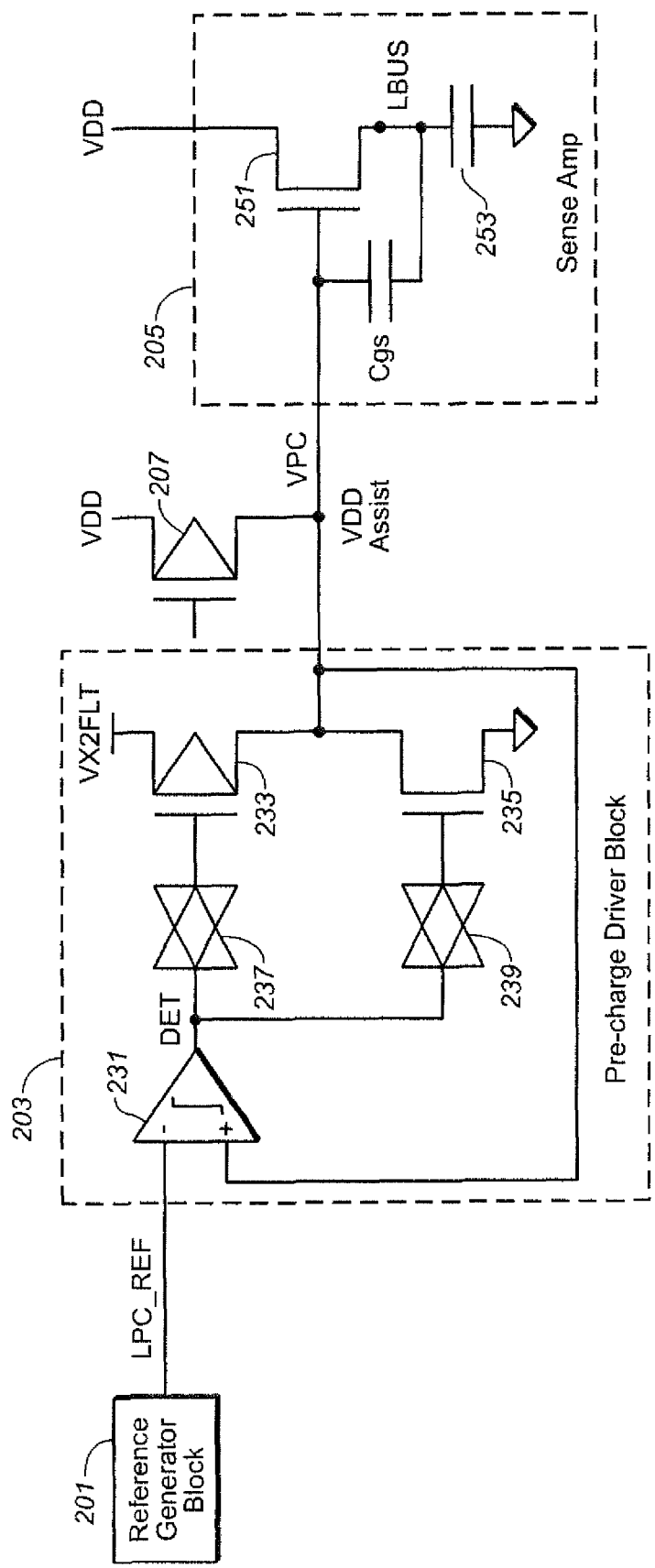
FIG. 2 is a circuit diagram for a first exemplary embodiment.

FIG. 2 shows a first exemplary embodiment for pre-charge circuit. The bus LBUS in the sense amp structure 205 is represented as the node LBUS and the rest of the structure shown in FIG. 1 is schematically represented as the capacitive load 253. The LBUS node is supplied from the supply level VDD through the transistor 251, whose gate is controlled by the level VPC. The level VPC is the output of the pre-charge driver block 203, which has as input a reference level LPC_REF from the reference generator block 201. Comparison circuit inside of the pre-charge driver block compares this reference level LPC_REF with feedback from the VPC output to set the VPC level. In the embodiment of FIG. 2, the comparison circuitry is a comparator 231 with a first input connected to receive the reference voltage LPC_REF and the second input connected to the feedback loop. The output DET of the comparator 231 is connected to the gate of PFET 233 through a transfer gate 237 and to the control gate of an NFET 235 through the transfer gate 239. The transistor 235 is connected between the VPC node and ground and the transistor 233 is connected between VPC and a supply level VX2FLT. Here the supply level VX2FLT used above the PFET 235 is a higher level than VDD; for example, VDD could be something like 2V and VX2 with a value of ~4V could be from a charge pump, which is then filtered to provide a smoother, but slightly lower value of VX2FLT. As discussed further below, during a pre-charge operation the transfer gates 237 and 239 are used to initial connect the detector 231 to the PFET 235, and then switch to the NFET 235 after one or a few pulses. Also shown in FIG. 2 is the gate-source capacitive coupling Cgs of the pass gate 251 that, without controlling the VPC level by the driver block 203 would tend to cause the VPC level to float based upon the LBUS level.

FIG. 2 includes an optional transistor 207 connected between VDD and VPC outside of the driver block 203 to provide an extra VDD assist. This PFET can be turned on briefly before enabling the PFET 233 to bring up the VPC level more quickly at first. As the assist transistor 207 is outside of the feedback loop and not controlled by the comparison circuitry 231, after this initial boost it is turned off and the VPC level is controlled based on DET.

Figure 3:
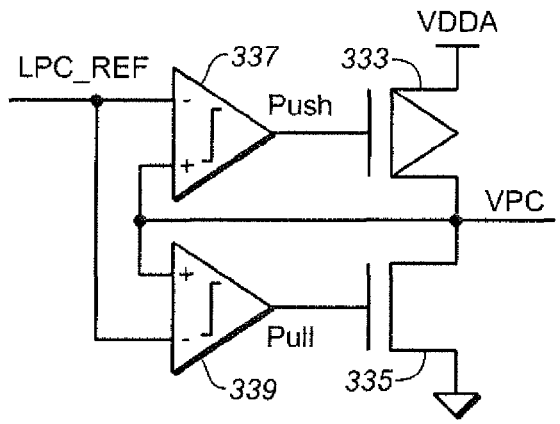
FIG. 3 shows an alternated embodiment.

FIG. 3 shows an alternate embodiment of the pre-charge driver block, where instead of a single comparator the comparison circuitry now includes two comparators 337 and 339, both connected to have LPC_REF at one input and VPC feedback at the other. The transistors 333 and 335 are arranged as in FIG. 2, except that their gates are respectively connected to the outputs of 337 and 339.

Figure 4:
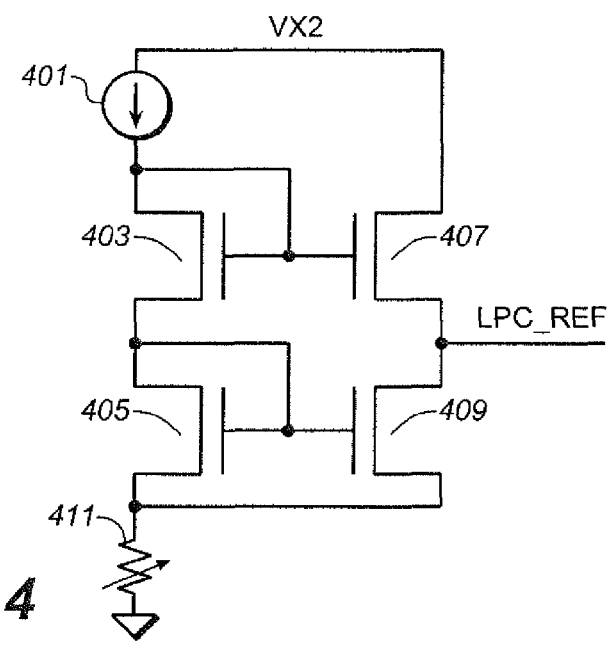
FIG. 4 provides more detail for the reference generator block of FIG. 2.

FIG. 4 is an exemplary embodiment for the reference generator 201. The circuit includes a first leg of a current source 401 in series with a pair of diode connected transistors 403 and 405 between the supply level VX2 and ground. Here, the supply level is taken as output of a charge pump and, as discussed above, is related to the VX2FLT level discussed above, which has been filter filtered to reduce the noise of the pumped VX2 level. (This use of a level higher than VDD, such as ~4V in this example, allows for analog headroom concerns.) A second leg has a pair of transistors 407 and 409 in series between VX2 and ground, where the gates of 407 and 409 are respectively connected to the gates of 403 and 405 in a current mirror arrangement. Both legs are then connected to ground through the variable or trimmable resistance 411. The reference voltage LPC_REF is taken from the node between 407 and 409. The variable resistance value for 411 allows for the reference voltage LPC_REF to be variable, so that the level at the LBUS node of the system can generate a level of, say, 0.8-1.5V as wanted. Referring back to FIG. 2, for a given VPC level, the level set on LBUS during a pre-charge operation will depend upon the voltage threshold Vth of the LBUS passgate 251. The reference generator of FIG. 4 is relatively simple design that tracks Vth, so that process dependency can be removed as LPC_REF itself is generated with a Vth dependency that can be used to cancel the Vth dependency on the LBUS passgate.

For any of the preferred embodiments, the pre-charge driver uses a push-pull arrangement for the circuit, with a push (such as through 233 or 333) to inject current for the pre-charge and a pull (such as through 235 or 335) to remove current from coupling to the LBUS node. For example, in the embodiment of FIG. 3, both comparators can be on at the operation, but with the comparator inputs are skewed to create dead band between when 333 shuts off and 335 comes on. Alternately, only the push comparator 337 is on at the beginning of the pre-charge process. After triggering some number of push pulses, the push comparator 337 is turned off and the pull comparator 339 is turned on. The pull comparator can remain on for the rest of the pre-charge operation. Relative to having both comparators on, this arrangement has the advantage of consuming half the amount of current Icc for the comparators.

For the embodiment of FIG. 2, only the single comparator 231 is used, with only push switch 237 turned initially for some number of pulses. The push switch 237 is then turned off and the pull switch 239 is turned on. This embodiment has the advantage that both the circuit area and Icc draw is around half that of using two comparator that are both on.

Figure 5:
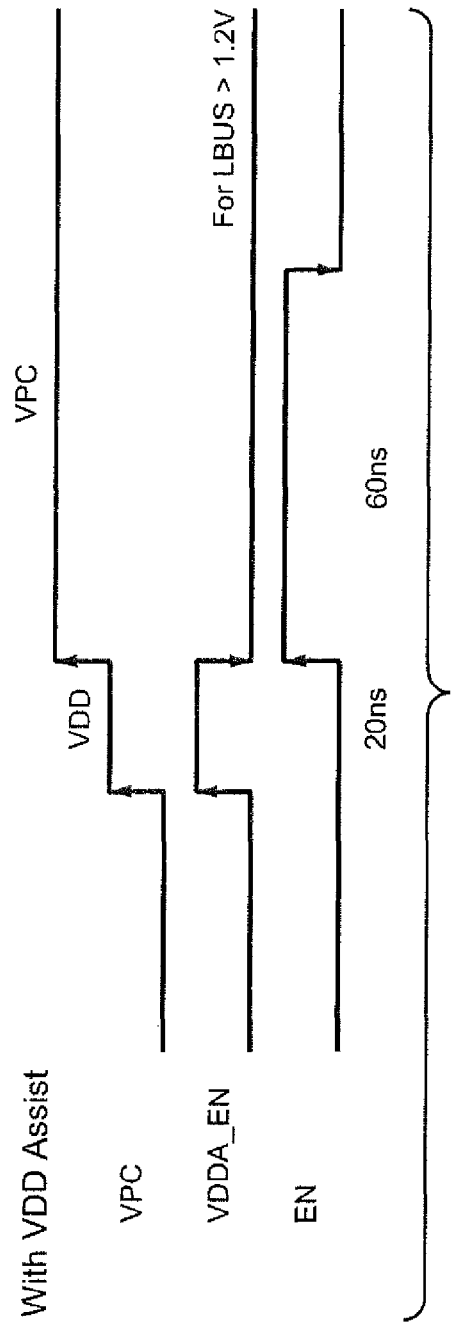
FIGS. 5 and 6 are timing diagrams for some of the control signals in FIG. 2.
Figure 6:
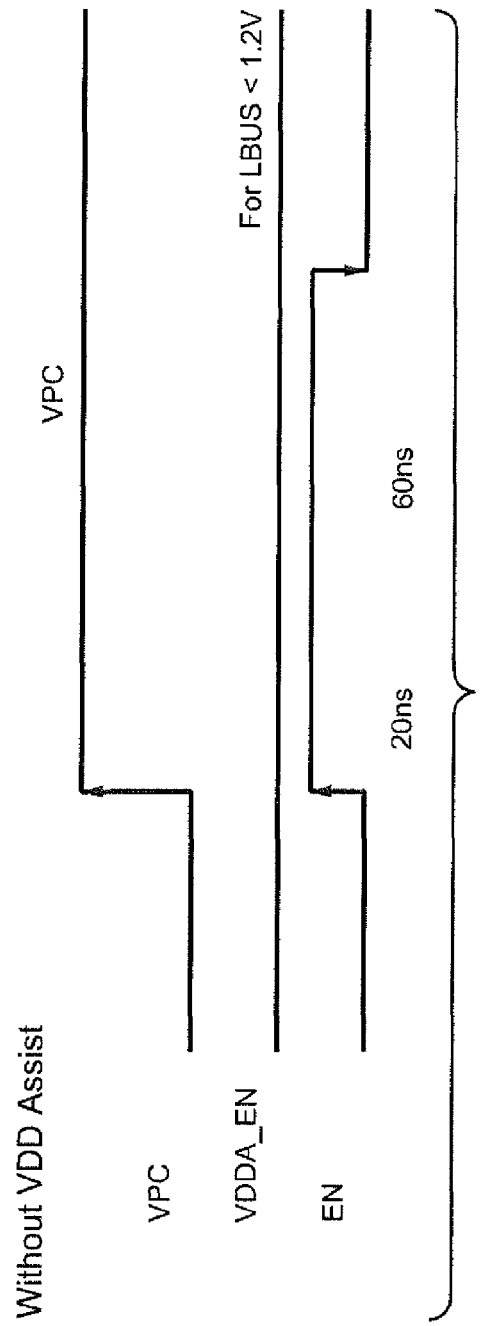

FIGS. 5 and 6 respectively show an example of timing for pre-charge schemes to illustrate the use of the VDD assist of 207 when a higher LBUS pre-charge (such as for an LBUS level of more than, say, 1.2V) and not using the VDD boost (such as for an LBUS level of more than, say, 1.2V). As shown in the FIG. 5, the output of the driver (the VPC level) is initially at ground. At the beginning of the pre-charge operation, the VDD boost transistor is enabled for a time, taking VPC up to VDD. This is shown at VDDA_EN, which is enable signal for the assist transistor 207 (FIG. 2 where, as this is implemented as a PFET, the signal would be inverted before reaching to the gate of 207). The boosting transistor is then turned off and the pre-charge driver in enabled as shown at EN, taking VPC the rest of the way up to the desired level. In the case of FIG. 6, the boosting transistor is never turned on (or is absent), as shown by its enable signal on the middle line. Instead, the VPC level is initially at ground, rising to the desired level when the driver is enabled at shown at the bottom.

Figure 7:
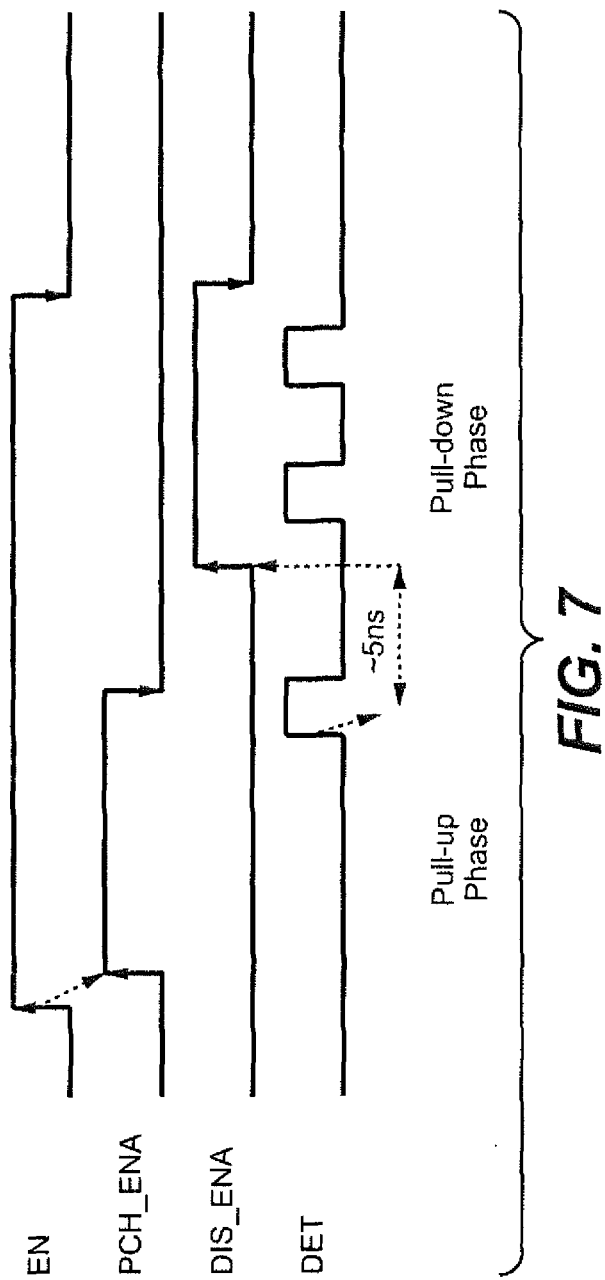
FIG. 7 is a timing diagram for operational amplifier pull-up and pull-down control.

FIG. 7 looks at the driver timing for the embodiment of FIG. 2. At top is the signal EN for when the driver is enabled. After the driver is enabled, the pull-up transfer gate 237 is turn on as shown by the control signal PCH_ENA to pre-charge LBUS. The output of the comparator 231 is shown at DET. After some number (here, just one) of pulses, the pull-up transfer gate is disabled. A delay is then introduced so that DET does not pass through to the NFET pull-down gate 235 for unwanted discharge. The NFET 235 is then enabled as shown at DIS_ENA for the pull down phase in order to pull off any coupled charge for the Cgs capacitive coupling of the pass gate 251. Once the pre-charge phase is over (here after two pulses), EN, along with DIS_ENA, go low. The delay between the pull-up and pull-down phases helps to prevent false detection after switching the control from the transistor 233 to the transistor 235 and in the exemplary embodiment is just taken to be a fixed value, but more generally could be a trimmable parameter. The number of pulses that the comparator can take before enabling to the second, pull-down transistor can also be settable; however, this typically would take Log(n) of flip-flops to implement. The exemplary embodiment has two flip flops that can determine whether 1 or 2 detection pulses are needed before enabling the pull-down transistor. Depending on the particulars of the circuit, multiple pulses may be needed due to high resistance of the VPC routing. The VPC level at the detection side might trigger, whereas the VPC level at the very far side (for the gate of the pass transistor) would still be below the target level. The consequence of having too few pulses is that after charge sharing, the VPC level would be below the expected value.

For any of the embodiments, the described pre-charge circuit has the advantage of reducing power consumption. Further, it reduces the process dependency of the pre-charge level as the Vth of the pass gate is tracked by the reference generator circuit. These improvements can help to maximize power savings.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A pre-charge circuit, comprising:
    a supply transistor connected between a first supply level and a pre-charge output node;
    a reference generator block to provide a reference voltage level;
    a pre-charge driver block, connected to receive the reference voltage level and having an output connected to a gate of the supply transistor, the pre-charge driver block including:
        a first transistor connected between a second supply level and the output of the pre-charge driver block;
        a second transistor connected between the output of the pre-charge driver block and ground; and
        comparison circuitry connected to receive the reference voltage level and feedback from the output of the pre-charge driver block and connected to gates of the first and second transistors, wherein during a pre-charge operation the comparison circuitry is initially enabled to control the first transistor and, after a delay, subsequently enabled to control the second transistor.

2. The pre-charge circuit of claim 1, wherein the second supply level is at a higher voltage than the first supply level.

3. The pre-charge circuit of claim 1, wherein the comparison circuit includes:
    a comparator having a first input connected to receive the reference voltage level and a second input connected to receive the feedback, and
    wherein the pre-charge driver block further includes:
        first and second transfer gates through which an output of the comparator is respectively connected to the gates of the first and second transistors, wherein the comparison circuitry is enabled to control the first transistor by turning on the first transfer gate and enabled to control the second transistor by turning on the second transfer gate.

4. The pre-charge circuit of claim 1, wherein the comparison circuit includes
    a first comparator having a first input connected to receive the reference voltage level and a second input connected to receive the feedback and having an output connected to the gate of the first transistor, and
    a second comparator having a first input connected to receive the reference voltage level and a second input connected to receive the feedback and having an output connected to the gate of the second transistor,
    wherein the comparison circuitry is enabled to control the first transistor by enabling the first comparator and enabled to control the second transistor by enabling the second comparator.

5. The pre-charge circuit of claim 1, wherein the first transistor is a PFET device and the second transistor is an NFET device.

6. The pre-charge circuit of claim 1, further comprising:
    a third transistor connected between the first supply level and the output of the pre-charge driver block, wherein during the pre-charge operation the third transistor is turned on for an interval prior to the comparison circuitry being enabled to control the first transistor.

7. The pre-charge circuit of claim 1, wherein the pre-charge circuit is connected to pre-charge a data bus.

8. The pre-charge circuit of claim 7, wherein the data bus is an internal bus for a sense amplifier circuit.

9. The pre-charge circuit of claim 1, wherein the reference generator block includes:
    a first leg having first and second diode connected transistors connected in series between a third supply level and ground; and
    a second leg having first and second transistors connected in series between the third supply level and ground, where gates of the first and second transistors of the second leg are respectively connected to gates of the first and second diode connected transistors of the first leg,
    wherein the first and second legs are connected to ground though a first resistance and the reference voltage level is taken from a node between the first and second transistors of the second leg.

10. The pre-charge circuit of claim 9, wherein the first resistance is variable.

11. The pre-charge circuit of claim 9, wherein the second supply level is a filtered version of the third supply level.

12. The pre-charge circuit of claim 1, wherein the comparison circuitry is initially enabled to apply to the gate of the first transistor a first number of pulses before being subsequently enabled to control the second transistor.

* * * * *